United States Patent
Krol et al.

(10) Patent No.: US 10,585,358 B2
(45) Date of Patent: Mar. 10, 2020

(54) METHOD FOR MANUFACTURING A FLAT POLYMER COATED ELECTROSTATIC CHUCK

(71) Applicant: Corning Incorporated, Corning, NY (US)

(72) Inventors: Mark Francis Krol, Painted Post, NY (US); John Stephen Peanasky, Big Flats, NY (US)

(73) Assignee: Corning Incorpotated, Corning, NY (US)

( * ) Notice: Subject to any disclaimer, the term of this patent is extended or adjusted under 35 U.S.C. 154(b) by 0 days.

(21) Appl. No.: 16/131,215

(22) Filed: Sep. 14, 2018

(65) Prior Publication Data
US 2019/0086816 A1    Mar. 21, 2019

Related U.S. Application Data

(60) Provisional application No. 62/560,395, filed on Sep. 19, 2017.

(51) Int. Cl.
| | | |
|---|---|---|
| *B05D 3/02* | (2006.01) | |
| *B05D 3/12* | (2006.01) | |
| *G03F 7/20* | (2006.01) | |
| *H01L 21/687* | (2006.01) | |
| *H01L 21/683* | (2006.01) | |

(52) U.S. Cl.
CPC ....... *G03F 7/70783* (2013.01); *B05D 3/0254* (2013.01); *B05D 3/12* (2013.01); *G03F 7/70708* (2013.01); *H01L 21/6831* (2013.01); *H01L 21/68757* (2013.01); *H01L 21/68785* (2013.01)

(58) Field of Classification Search
None
See application file for complete search history.

(56) References Cited

U.S. PATENT DOCUMENTS

| 6,169,652 B1* | 1/2001 | Klebanoff | G03F 7/707 361/234 |
|---|---|---|---|
| 7,091,146 B2* | 8/2006 | Okiyama | C04B 35/117 501/128 |
| 2006/0008660 A1* | 1/2006 | Parkhe | B08B 1/00 428/446 |
| 2008/0316461 A1* | 12/2008 | Compen | G03F 7/707 355/73 |
| 2013/0120897 A1* | 5/2013 | Lin | H02N 13/00 361/234 |

OTHER PUBLICATIONS

Robert M. Jennings. An investigation of the effects of curing conditions on the residual stress and dimensional stability in polyimide films. ScholarWorks@UMMass AMherst. Doctoral Dissertations 1989. 1993. (Year: 1993).*

Loyd J Burcham. Steven Fields, Ray Allenbach, Charles E. Hoyl and Huanyu Wei. Curing Mechanisms Affecting Curl in UV Coated Laminate Constructions of Semi-Rigid Materials. UV & EB Technology Expo & Conference 2006. (Year: 2006).*

* cited by examiner

*Primary Examiner* — Dah-Wei D. Yuan
*Assistant Examiner* — Kristen A Dagenais-Englehart
(74) *Attorney, Agent, or Firm* — Amy T. Lang; John P. McGroarty

(57) ABSTRACT

A process for manufacturing a flat, polymer-coated electrostatic chuck platen involves imposing forces on the chuck to compensate for platen warpage induced during shrinkage of the polymer coating as it is cured.

15 Claims, 6 Drawing Sheets

METHOD FOR MANUFACTURING A FLAT POLYMER COATED ELECTROSTATIC CHUCK

This application claims the benefit of priority under 35 U.S.C. § 119 of U.S. Provisional Application Ser. No. 62/560,395 filed on Sep. 19, 2017 the content of which is relied upon and incorporated herein by reference in its entirety.

FIELD OF THE DISCLOSURE

This disclosure relates to lithography, and more specifically to electrostatic clamps or chucks used for holding a substrate, such as a reticle or mask, during extreme ultraviolet (EUV) photolithography.

BACKGROUND OF THE DISCLOSURE

The photolithography industry is developing Extreme Ultra-Violet (EUV) photolithography systems that operate at 13.5 nm wavelength. Due to the extremely short wavelength used, reflective optical components must be used in the implementation of these systems. Additionally, the surface of these reflective components must be extremely well controlled during manufacture of the components and during use in the end photolithographic application. One such critical reflective optical component is the photomask or reticle that contains the pattern to be lithographically printed on a silicon wafer. In an EUV photolithography system, the reticle is held by an electrostatic clamp. The clamp or chuck includes a generally planar or flat gripping surface referred to as a platen on which the reticle is seated and held in place by electrostatic forces. The reticle must be kept extremely flat during use, and as a result, the electrostatic chuck that holds the reticle must also be held to extremely tight flatness specifications.

A typical electrostatic chuck or clamp 500 is illustrated in FIG. 5. The mounting surface or platen 502 is provided with electrodes 506 for supplying currents necessary for electrostatic attraction. Chuck 500 includes a base 504 supporting platen 502 with electrodes 506 sealed between a base 504 and platen 502. The combination of platen 502, electrodes 506 and base 504 are generically referred to as an electrostatic chuck 500. A heater 508 can be embedded in base 504. Chuck 500 is fixed onto a backing plate 520 typically formed of a high thermally conducting metal. Backing plate 520 can include cooling water channels 522 for controlling temperature.

Recent reticle electrostatic clamp development activities by photolithographic system manufacturers have generated designs that use polymer coatings to help manage the electrostatic fields that are used to hold the reticle on the chuck. These polymers, while delivering the required electrostatic properties, induce bending in the chuck due to shrinkage during cross-linking thus making the chucks unsuitable for use in maintaining the flatness of the reticle during use.

SUMMARY OF THE DISCLOSURE

Disclosed are processes for making a flat, polymer-coated platen for a chuck of an electrostatic clamp used for holding a substrate in a highly precise planar configuration during a photolithographic process. In the disclosed processes, forces are applied to the platen to compensate for warpage of the platen induced by shrinkage of the polymer coating upon curing. Compensation for the warpage improves the flatness of the platen. In one embodiment, the platens are used in chucks of electrostatic clamps used to mount substrates in a photolithography process. Substrates include reticles, mirrors and other optical components used in photolithography.

In one aspect of this disclosure, the bending effect of shrinkage during curing of the coating composition used to form the polymer coating on the platen is alleviated by swelling the polymer coating with a solvent, applying a force to the platen that counteracts the bending induced by the polymer coating, and evaporating the solvent to provide a polymer-coated platen with improved flatness. In this process, a curable coating composition is applied to a gripping surface of a platen. As used herein, gripping surface refers to the surface of the platen on which the curable coating composition is applied. The curable coating composition is then cured to form a polymer coating on the gripping surface. Radiation-curable, thermally-curable, or a combination of radiation-curable and thermally-curable coating compositions may be used. Curing is achieved by exposing the coating composition to an appropriate temperature and/or by irradiating the coating composition with an appropriate radiation (e.g., ultraviolet radiation or electron beam radiation). Curing results in the transformation of the coating composition into a rigid crosslinked polymer coating that bonds to the gripping surface of the platen. Curing of the coating composition is accompanied by shrinkage. Contraction of the coating produces bending forces that cause the platen to bend. Bending introduce concavity on the gripping side of the platen. After curing, the polymer coating is imbibed with a solvent that causes the polymer coating to swell. The swelling may slightly reduce warpage of the platen. After swelling, a force is applied to the polymer-coated platen to counteract the concavity of the gripping surface. In one embodiment, the counteracting force is applied to overcompensate for the concavity of the gripping surface to provide a platen with a convex gripping surface. While maintaining the counteracting force, the solvent is removed (e.g. by evaporation induced by heating or vacuum). After the solvent is removed, the polymer-coated platen is released from the counteracting force. The resulting platen has improved flatness. In one embodiment, the flatness of the platen is sufficient to permit use of the platen in the chuck of an electrostatic clamp used in precise lithographic operations.

In another aspect of this disclosure, the platen is stressed before application of the curable coating composition to the gripping surface to introduce a pre-determined concavity to the gripping surface. The curable coating composition is then applied to the concave gripping surface of the stressed platen and cured. Thereafter, the stress on the polymer-coated platen is released to provide a polymer-coated platen with improved flatness. In one embodiment, the flatness of the platen is sufficient to permit use of the platen in the chuck of an electrostatic clamp used in precise lithographic operations.

DETAILED DESCRIPTION OF SPECIFIC EMBODIMENTS

Figure 1:
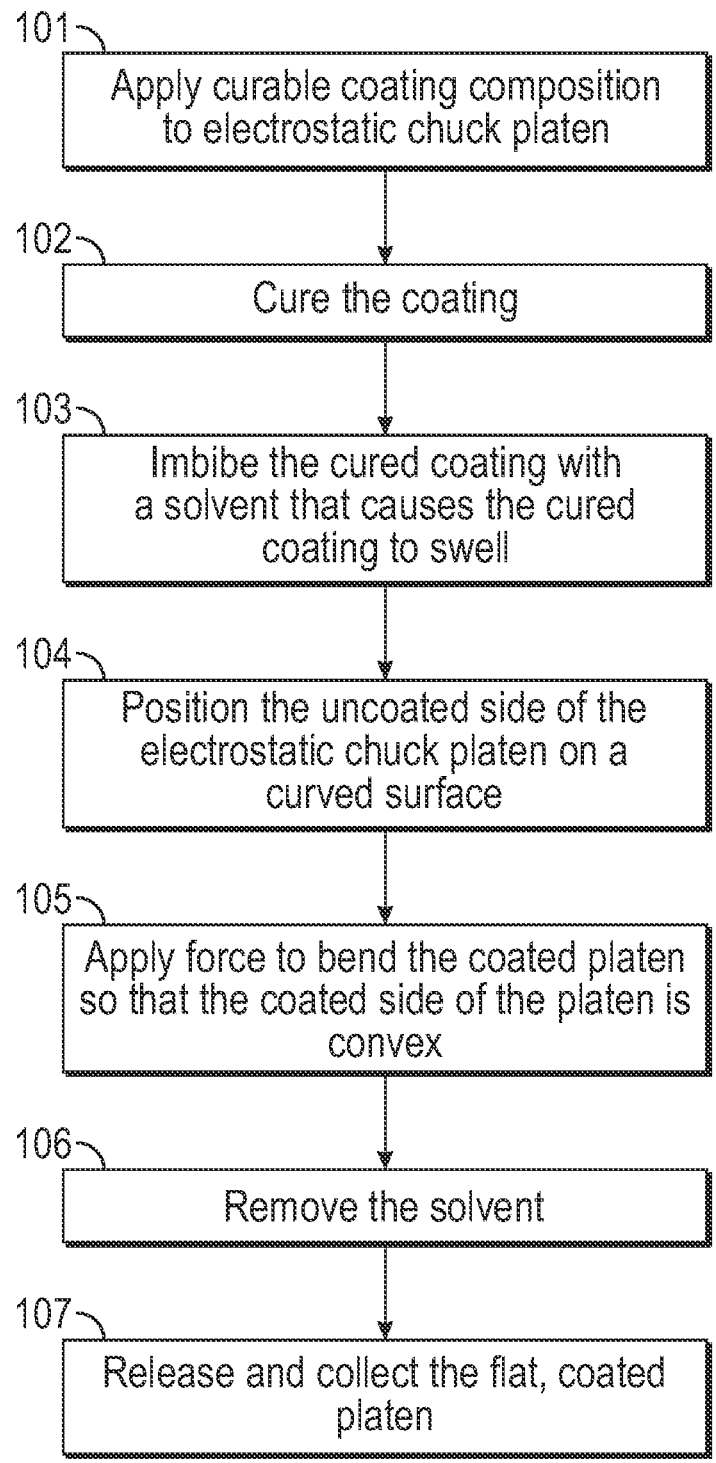
FIG. 1 is a flowchart of a process for manufacturing a flat polymer-coated platen in accordance with a first aspect of this disclosure.

A flowchart showing the steps of a process for manufacturing a flat, polymer-coated electrostatic platen for lithographic operations, in accordance with a first aspect of this disclosure, is shown in FIG. 1. While the disclosed processes are illustrated for making a platen for a chuck used to hold a reflective reticle in an electrostatic clamp for extreme ultraviolet lithography, the disclosed processes and resulting polymer-coated electrostatic platens are also suitable for holding other substrates and other applications, such as a silicon wafer upon which features are fabricated using photolithographic techniques. The disclosed processes and resulting polymer-coated electrostatic chuck platens are also usable with other lithographic techniques. The required flatness will depend on the type of lithographic techniques being employed and the dimensions of the features being fabricated.

In accordance with the process shown in FIG. 1 and FIGS. 2A-2G, the first step 101 involves applying a curable coating composition to the gripping surface of an electrostatic chuck platen. The curable coating composition is cured to yield a platen 201 having a polymer coating 202. The curable coating composition is preferably a liquid composition. In one embodiment, the curable coating composition is a viscous liquid composition. The curable coating composition can be a thermally-curable coating composition, a radiation-curable composition, a composition with a combination of thermally-curable components and radiation-curable components. Curable coating compositions that can be cured with radiation (e.g., ultraviolet radiation or electron beam radiation) and/or heat to form a crosslinked polymer network usable in the practice of the disclosed processes include radiation-curable compositions such as acrylates, epoxy acrylate, urethane acrylate, polyester acrylate, polyether acrylate, acrylic acrylate, silicone acrylate resins, and methacrylate or other substituted analogs thereof; and thermally-curable compositions such as polyester, epoxy, phenolic, vinyl ester, polyurethane, silicone, polyamide and polyamide-imide resins. Such curable compositions are comprised of monomers, oligomers, and/or polymers; cross-linkers (e.g., tri-functional, or more highly functional molecules); and may contain initiators, inhibitors, and/or other additives, as needed or desired. The coating composition may be applied to the surface of the platen using generally any known technique, such as spraying, brushing, roll-coating, dipping, etc. However, a preferred technique is spin-coating, which provides a very uniform coating thickness and is conducive to the objective of producing a flat, polymer-coated platen. The platen can be an organic (e.g. polymer) or inorganic (e.g. glass or metal) material. In one embodiment, the platen is fabricated of an ultra-low expansion glass (e.g., silica-titania glass) which has a very low coefficient of expansion.

Figure 2A:
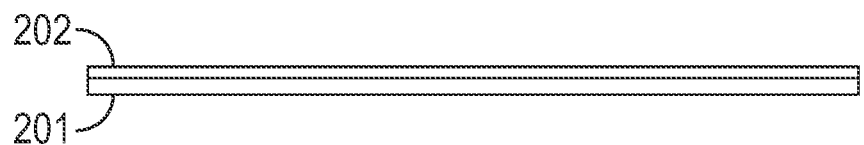
FIGS. 2A-2G illustrate a platen at various steps during the process of FIG. 1.
Figure 2B:
Figure 2C:

The coated composition on the gripping surface of platen 201 is then cured in step 102 to form polymer coating 202. Curing can be accomplished, for example by exposing the coating composition to a suitable radiation and/or elevated temperature. Curing causes the coating composition to react to form polymer coating 202. As curing proceeds, formation of polymer coating 202 is accompanied by contraction and binding with the gripping surface of platen 201. The binding and contraction that occurs as polymer coating 202 forms introduces a force that causes the platen to bend or warp. The gripping, surface of the polymer-coated platen becomes concave, as shown in FIG. 2B.

In step 103, the polymer coating 202 is imbibed with a solvent that causes the coating to swell. The solvent is selected so that it has a solubility parameter similar to that of the components (e.g., oligomers or polymers) of the coating composition, and so that it is compatible with the cured coating. In one embodiment, the solvent is selected so that it has the effect of lowering the glass transition temperature ($T_g$) of the cured polymer coating 202, thus allowing the cured polymer coating 202 to be worked or shaped.

Figure 2D:
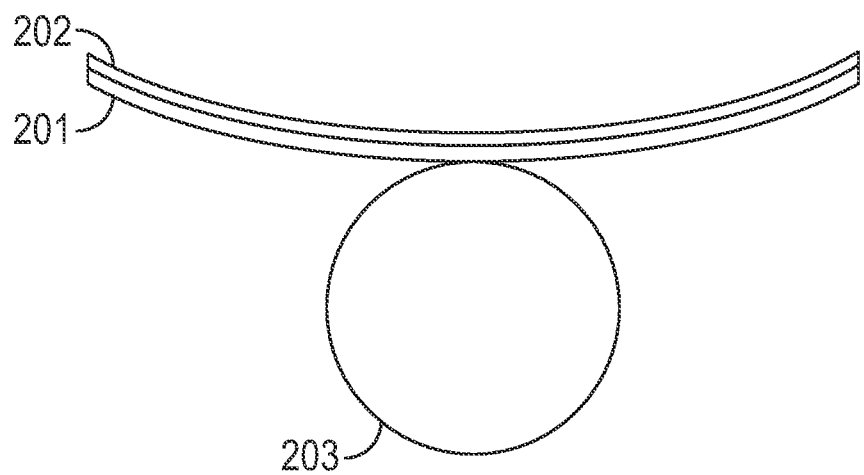

The platen 201 having a swollen polymer coating is then placed on a mandrel 203 having a curved surface (e.g., spherical or cylindrical) in step 104. It is not necessary that the entire mandrel 203 has a curved shape, as shown in FIG. 2D. It is sufficient that the portion of the mandrel that is in contact with the platen 201 is curved.

Figure 2E:
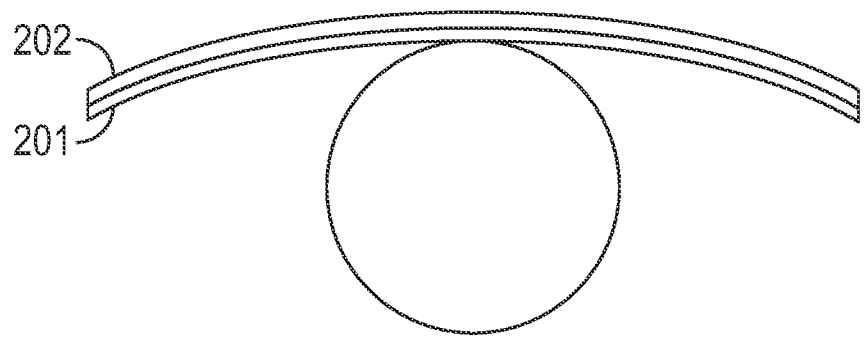

A force is then applied in step 105 to the edges of platen 201 (held by a jig) to cause the platen to bend in the direction opposite of the bend originally caused by shrinkage of coating composition to form polymer coating 202, so that the gripping surface of platen 201 exhibits a predetermined amount of convexity, as shown in FIG. 2E.

Figure 2F:
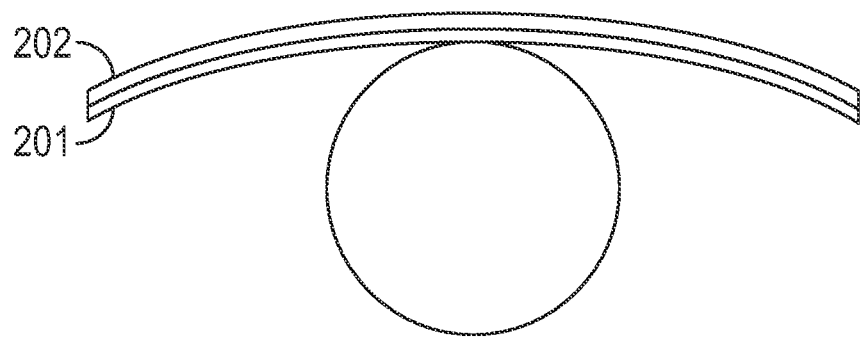

While maintaining the predetermined convexity of the gripping surface using a fixture or jig, the solvent is removed from the swollen polymer coating in step 106 (FIG. 2F). This can be done using heat and/or vacuum to evaporate the solvent.

Figure 2G:
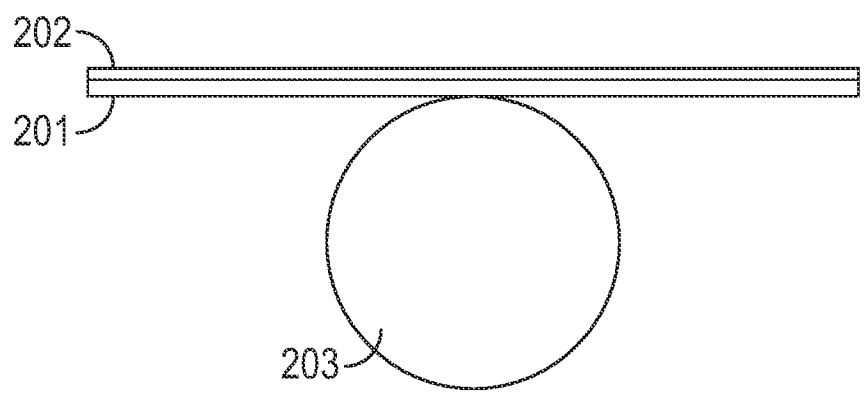
Figure 3:
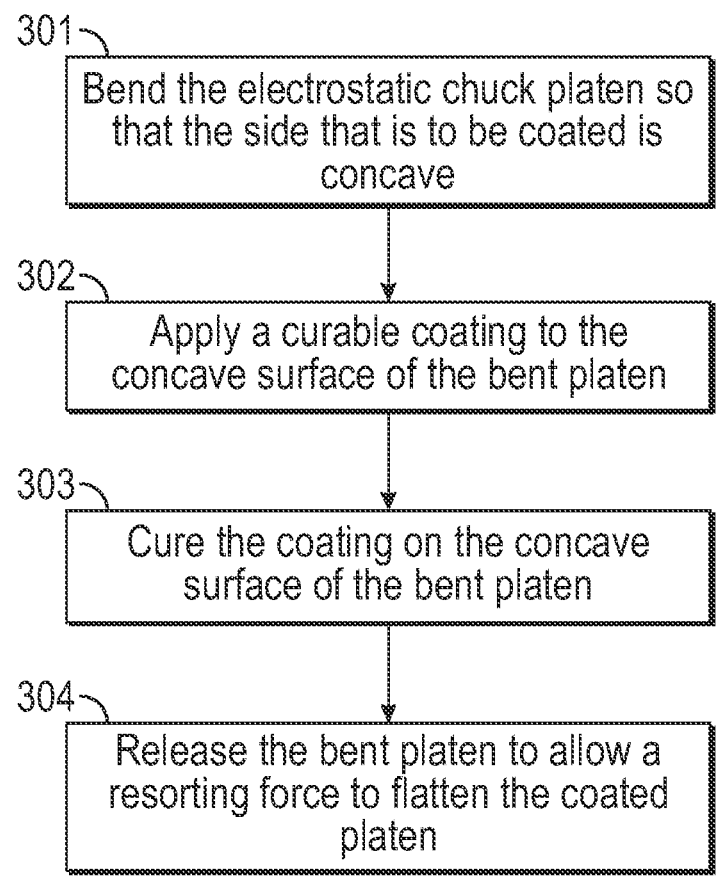
FIG. 3 is a flowchart of a process for manufacturing a flat polymer-coated electrostatic chuck platen in accordance with a second aspect of this disclosure.

After the solvent has been removed from the polymer coating, the polymer-coated platen can be released from the fixture to yield a flat, polymer-coated electrostatic chuck platen (FIG. 2G). Routine experimentation may be needed to determine the appropriate amount of force and/or predetermined convexity of the gripping surface. The appropriate force will depend on various factors such as the thickness and other dimensions of the platen, the selected coating composition and thickness, the mechanical properties of the polymer coating and/or platen, etc.

A flowchart showing the steps of a process for manufacturing a flat, polymer-coated electrostatic platen for lithographic operations, in accordance with a second aspect of this disclosure, is shown in FIG. 3 and FIGS. 4A-4C. In this aspect of the disclosure, the platen 201 is pre-stressed to impart a restoring force to the platen that is predetermined to counter the warping effect induced by the subsequent curing of a coating composition applied to the gripping surface of the platen. Unless otherwise indicated, the materials comprising platen 201 and polymer coating 202 in this second aspect can be generally any of the materials usable in the process described above for the first aspect of the disclosure.

Figure 4A:
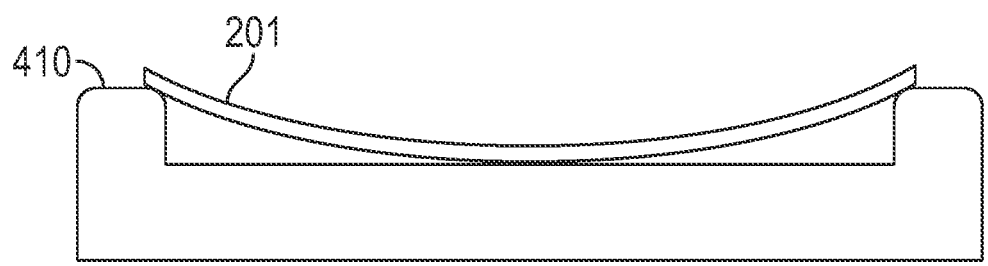
FIGS. 4A-4C illustrate a platen at various steps during the process of FIG. 3.
Figure 4B:
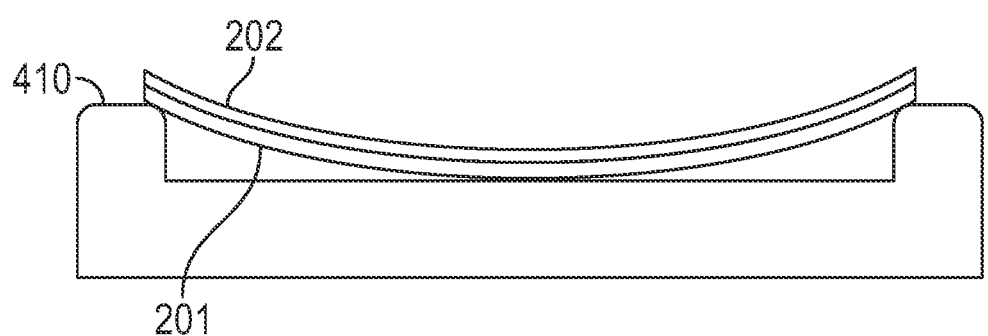
Figure 4C:
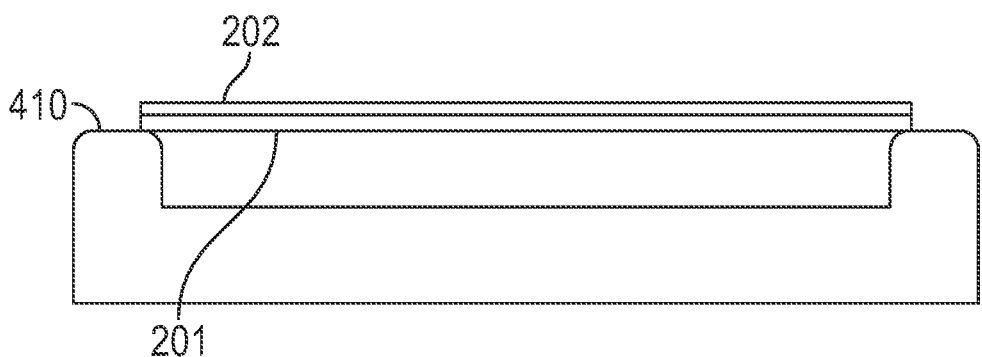
Figure 5:
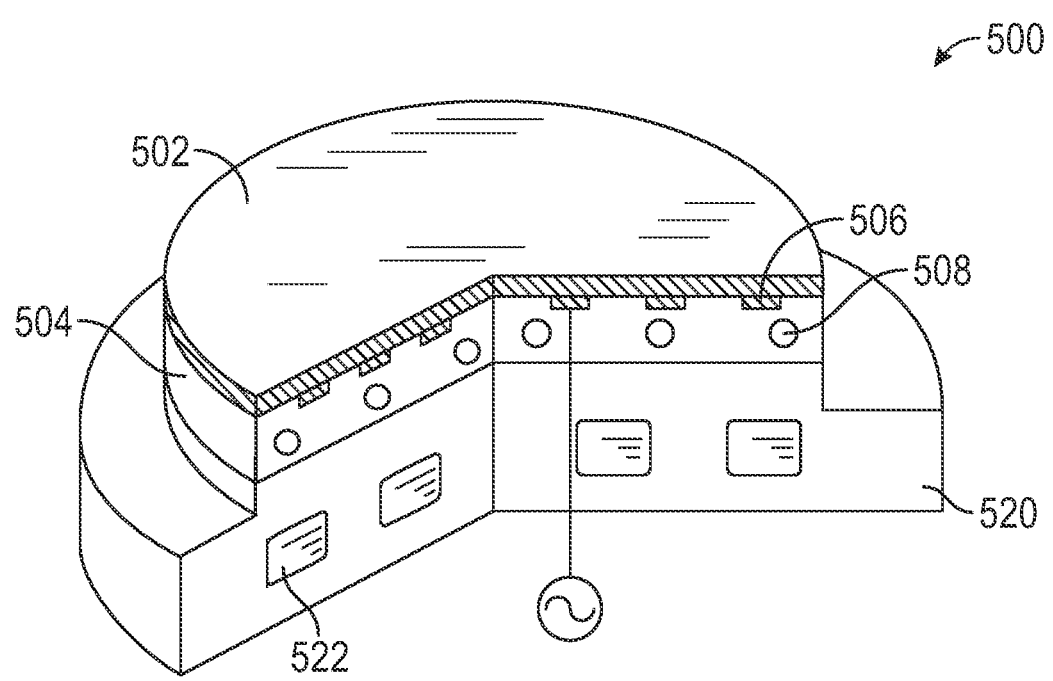
FIG. 5 is a diagram of a typical electrostatic chuck.

In the first step 301, the platen 201 is bent before applying a curable coating, as shown in FIG. 4A to form a concave gripping surface. A mandrel (not shown, but similar to mandrel 203 of FIG. 2D) can be pressed against a central section of platen 201 resting on a fixture 410 to create a predetermined amount of concavity of the gripping surface of the platen. Routine experimentation may be needed to determine the appropriate force or concavity needed to produce a flat polymer-coated platen upon completion of the remaining steps.

In step 302, a curable coating composition is then applied to the upper or gripping side of platen 201.

Alternatively, a curable coating composition can be applied to a flat platen that is subsequently bent before curing.

In step 303, the curable coating composition is cured to form polymer coating 202 (FIG. 4B), such as with heat and/or radiation.

In step 304, the force applied to the platen 201 is removed to produce a flat, polymer coated electrostatic chuck platen suitable for use in extreme ultraviolet or other photolithographic applications. Removal of the force is accomplished by releasing platen 201 from fixture 410.

The described embodiments are preferred and/or illustrated, but are not limiting. Various modifications are considered within the purview and scope of the appended claims.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or description that the steps are to be limited to a specific order, it is no way intended that any particular order be inferred.

What is claimed is:

1. A process for manufacturing a polymer-coated platen, comprising:
    applying a curable coating composition to a gripping surface of a platen;
    curing the curable coating composition, the curing causing concave bending of the platen, and
    applying a force to the platen, the force being effective to counter the concave bending, wherein the force is sufficient to remove the concave bending.

2. The process of claim 1, wherein the force causes convex bending of the gripping surface.

3. The process of claim 1, further comprising discontinuing the force, the gripping surface relaxing upon the discontinuing of the force to a state having less of the concave bending.

4. The process of claim 3, wherein the state having less of the concave bending is flat.

5. The process of claim 1, wherein the curing induces formation of a polymer coating on the gripping surface, the formation causing the concave bending, and wherein the force is applied by clamping edges of the polymer-coated platen and compressing a center section of the platen against a curved surface to bend the polymer-coated platen.

6. The process of claim 1, wherein the force is applied before and during application of the curable coating composition, and before and during the curing; and
    further comprising discontinuing application of the force after the curable coating composition has cured.

7. The process of claim 1, wherein the platen comprises glass.

8. The process of claim 7, wherein the glass comprises a titania-silica glass.

9. The process of claim 1, wherein the curable coating composition is radiation curable.

10. The process of claim 9, wherein the radiation-curable coating composition is selected from the group consisting of epoxy acrylate, urethane acrylate, polyester acrylate, polyether acrylate, acrylic acrylate and silicone acrylate resins.

11. The process of claim 1, wherein the curable coating composition is thermally curable.

12. The process of claim 11, wherein the thermally-curable coating composition is selected from the group consisting of polyester, epoxy, phenolic, vinyl ester, polyurethane, silicone, polyamide and polyamide-imide resins.

13. The process of claim 1, wherein the curing induces formation of a polymer coating on the gripping surface, the formation causing the concave bending.

14. The process of claim 13, further comprising imbibing the cured polymer coating with a solvent that causes the cured polymer coating to swell.

15. The process of claim 14, wherein the force is applied to the swelled polymer coating.

\* \* \* \* \*